(12) United States Patent
Löher et al.

(10) Patent No.: US 8,861,220 B2
(45) Date of Patent: Oct. 14, 2014

(54) METHOD FOR GENERATING AN ELECTRONIC SYSTEM, METHOD FOR GENERATING A FREEFORM SURFACE HAVING SUCH A SYSTEM, AND ELECTRONIC SYSTEM AND FREEFORM SURFACES HAVING SUCH A SYSTEM

(75) Inventors: Thomas Löher, Berlin (DE); Andreas Ostmann, Berlin (DE); Manuel Seckel, Berlin (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 197 days.

(21) Appl. No.: 13/381,552

(22) PCT Filed: Jun. 29, 2010

(86) PCT No.: PCT/EP2010/004099
§ 371 (c)(1),
(2), (4) Date: Mar. 27, 2012

(87) PCT Pub. No.: WO2011/000580
PCT Pub. Date: Jan. 6, 2011

(65) Prior Publication Data
US 2012/0176764 A1 Jul. 12, 2012

(30) Foreign Application Priority Data
Jun. 29, 2009 (DE) .......................... 10 2009 031 568

(51) Int. Cl.
*H01R 9/00* (2006.01)
*H05K 1/18* (2006.01)
(Continued)

(52) U.S. Cl.
CPC .............. *H05K 1/0283* (2013.01); *H05K 3/284* (2013.01); *H05K 1/189* (2013.01); *H05K 1/038* (2013.01); *A41D 1/005* (2013.01); *H05K 2201/09263* (2013.01)

USPC ........................... 361/776; 361/777; 174/254

(58) Field of Classification Search
USPC .......................................... 361/777; 174/254
See application file for complete search history.

(56) References Cited

U.S. PATENT DOCUMENTS

| 8,207,473 B2 * | 6/2012 | Axisa et al. .............. 219/121.72 |
| 2002/0094701 A1 * | 7/2002 | Biegelsen et al. ............... 439/32 |

(Continued)

FOREIGN PATENT DOCUMENTS

| EP | 1926355 | 5/2008 |
| WO | WO-2005/031550 | 4/2005 |
| WO | WO 2008152575 A1 * | 12/2008 |

OTHER PUBLICATIONS

Linz et al., Embroidering Electrical Interconnects with Conductive Yarn for the Integration of Flexible Electronic Modules into Fabric, 2005, IEEE, Proceedings of the 2005 Ninth IEEE International Symposium on Wearable Computers.*

(Continued)

*Primary Examiner* — Lisa Lea Edmonds
*Assistant Examiner* — Keith Depew
(74) *Attorney, Agent, or Firm* — Schwegman Lundberg & Woessner, P.A.

(57) ABSTRACT

The invention relates to a method for generating an electronic system for application to freeform surfaces, a method for producing freeform surfaces having an electronic system, and an electronic system and a combination of a freeform surface having at least one such system. According to the invention, an elastic interconnect device having an elastic substrate and an elastic, fanned-out contact structure with contact surfaces comprised of conductor lines is generated first. Then, electronic components are mounted on the interconnect device. Finally, the interconnect device is encapsulated. If a freeform surface with an electronic system is to be generated, the electronic system produced in this way is then mounted on the previously provided freeform surface.

25 Claims, 4 Drawing Sheets

Figure 1A:
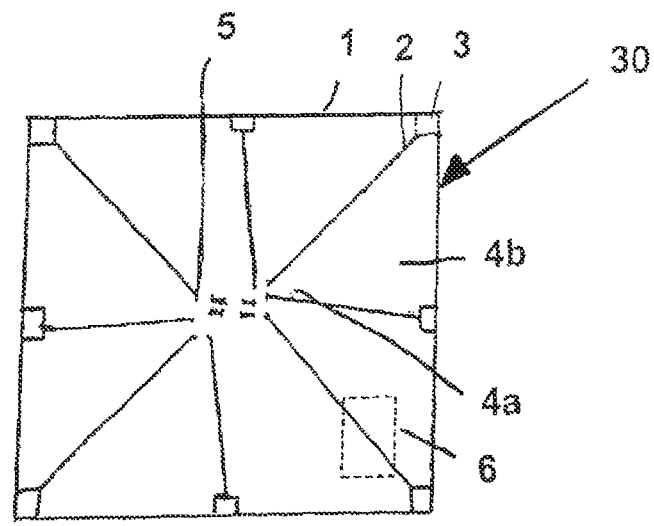
Figure 1B:
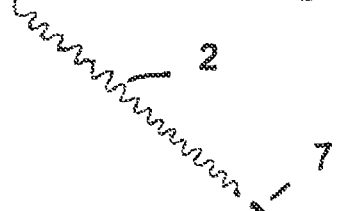

(51) Int. Cl.
  *H05K 1/02* (2006.01)
  *H05K 1/03* (2006.01)
  *H05K 3/28* (2006.01)
  *A41D 1/00* (2006.01)

(56) References Cited

U.S. PATENT DOCUMENTS

| | | | |
|---|---|---|---|
| 2004/0224138 A1* | 11/2004 | Farrell et al. | 428/209 |
| 2004/0243204 A1 | 12/2004 | Maghribi et al. | |
| 2005/0280157 A1 | 12/2005 | Roush et al. | |
| 2007/0053179 A1 | 3/2007 | Pang et al. | |
| 2008/0157235 A1 | 7/2008 | Rogers et al. | |
| 2008/0257589 A1* | 10/2008 | Ostmann et al. | 174/254 |
| 2012/0051005 A1* | 3/2012 | Vanfleteren et al. | 361/749 |

OTHER PUBLICATIONS

"International Application No. PCT/EP2010/004099, International Search Report and Written Opinion mailed Sep. 30, 2010", 17 pgs.

* cited by examiner

METHOD FOR GENERATING AN ELECTRONIC SYSTEM, METHOD FOR GENERATING A FREEFORM SURFACE HAVING SUCH A SYSTEM, AND ELECTRONIC SYSTEM AND FREEFORM SURFACES HAVING SUCH A SYSTEM

PRIORITY CLAIM TO RELATED APPLICATIONS

This application is a national stage application under 35 U.S.C. §371 of PCT/EP2010/004099, filed Jun. 29, 2010, and published as WO 2011/000580 A1 on Jan. 6, 2011, which claims priority to German Application No, 10 2009 031 568.3, filed Jun. 29, 2009, which applications and publication are incorporated by reference as if reproduced herein and made a part hereof in their entirety, and the benefit of priority of each of which is claimed herein.

The present subject matter relates to a method for generating an electronic system for applying onto freeform surfaces, to a method for generating freeform surfaces having an electronic system and to an electronic system and to a combination of a freeform surface with at least one such system.

The most important field of application for such electronic systems is textile electronics. In accordance with another approach, for comparison, interconnect devices can be fastened onto textiles such as articles of clothing. However, in so doing, they usually influence the properties of the textiles in a negative manner. Electronic systems applied to articles of clothing reduce the wearing comfort of the clothing, for example.

In accordance with another approach, for comparison, electronic systems are produced for applying to freeform surfaces in that a contact structure and subsequently electronic components are applied to a substrate. Freeform surfaces having electronic systems are produced in that electronic systems manufactured in this manner are bonded on or stitched on and are subsequently encapsulated.

In accordance with another approach, for comparison, freeform surfaces can only be equipped with electronic systems which are curved in a maximum of one spatial direction. This restricts the area of use with respect to rigid freeform surfaces since an application onto rigid freeform surfaces curved in a plurality of spatial directions is not possible. This has the result with respect to stretchable freeform surfaces such as textile carriers, that the textile carrier can only be curved in one spatial direction after it has been equipped.

An underlying objective can include providing a method for generating an electronic system, wherein the generated electronic system should be able to be applied to freeform surfaces shaped in any desired manner. A further objective can include providing an electronic system which does not reduce, or only insignificantly reduces, the wearing comfort on application onto textile carriers, in particular articles of clothing. A further objective can include enabling the application onto the freeform surface in as simple a manner as possible.

The method in accordance with the invention provides that a stretchable substrate which comprises stretchable material at least to a predominant extent is first provided, with a stretchable contact structure which fans open and which has contact surfaces being applied onto or worked into this substrate. Electronic components are subsequently applied to the interconnect device generated in this manner which is also called an interposer. Any desired electronic components can be mounted in this respect. After the application of the electronic components, the now present interconnect device is encapsulated by a stretchable material. Encapsulation here means that a stretchable material is applied to at least the electronic components as well as to a region of the contract structure which fans open (the contact surfaces can optionally be exempted from the encapsulation).

Electronic systems are generated by this manufacturing method in accordance with the invention which are predominantly stretchable and can thus also be applied to multidimensional freeform surfaces, with the properties of the freeform surface such as the deformability, flexibility and movability only being slightly negatively influenced or not being negatively influenced at all. An electronic system manufactured in this manner is, for example, suitable to be applied to an article of clothing, with the wearing comfort only being minimally reduced. Since the contact structure is formed as a contact structure which fans open, it is possible without a loss of reliability to connect contacts of electronic components disposed close to one another using cruder means for the contacting such as conductive yarns, for example. Electronic systems manufactured by this manufacturing method are thus suitable to be connected to one another using such means.

The fitting with electronic systems only becomes possible for some rigid freeform surfaces thanks to the flexibility of the electronic system. The advantage results for non-rigid freeform surfaces that a flexibility and bendability of the freeform surface is only insignificantly reduced by the electronic system.

In an advantageous embodiment of the invention, the interconnect device and/or the encapsulation material is/are closed, i.e. is/are formed without openings leading to the electronic components. Openings of this type such as are generally present with textile carriers due to a fabric structure are disadvantageous, for example, with respect to a washability of the electronic system. In contrast, a hermetic encapsulation which can in particular be of film type and fluid-tight and is applied without openings allows a washability of the electronic system.

The interconnect device and/or the encapsulation material can equally advantageously be formed as homogenously stretchable.

The freeform surface can advantageously be a movable carrier such as a textile carrier or a felt-like carrier or a film or a rigid freeform surface.

The substrate and/or the encapsulation can preferably comprise a polymer and particularly preferably an elastomer. The substrate can particularly preferably comprise the same material as the encapsulation. It is equally possible that the substrate admittedly does not comprise the same material as the encapsulation, but that at least some mechanical material parameters of the substrate material and of the encapsulation material are identical. Particularly preferably, at least the modulus of elasticity and/or the thermal coefficient of expansion is identical. It is hereby achieved that no damage arises even through frequent bending and through frequent heating and cooling.

The application to the freeform surface can in particular take place by bonding, laminating, riveting or stitching.

It is particularly advantageous for facilitating the application if the substrate and/or the encapsulation comprise a thermoplastic material and particularly preferably a thermoplastic elastomer since it is hereby made possible for the application of the electronic system to heat either the electronic system or the freeform surface to a temperature at which the thermoplastic materials has self-adhesive properties. The electronic system is then pressed onto the freeform surface and thus connected to it. In this manner, the electronic system can be applied to a freeform surface, with no further bonding layer being required.

This can either take place in an advantageously simple manner on the manufacture of a freeform surface having an applied electronic system at the point of manufacture or can be left to the final user.

The latter is very particularly advantageous since a user can thus select different electronic systems which are supplied fully encapsulated and can then apply them himself, for example by ironing on, to an article of clothing of his choice. The user is thus not restricted to specific combinations of electronic systems and freeform surfaces provided by a manufacturer but can rather freely combine electronic systems and freeform surfaces. An application of the electronic system on the user side is naturally not only possible with stretchable freeform surfaces, but also equally with rigid freeform surfaces. A user can thus apply a fully fabricated, and preferably already tested, electronic system to a rigid freeform surface, for example in an automobile.

It is advantageous if the application can take place at a temperature between 100° C. and 200° C., particularly preferably 120° C. to 180° C., in particular 150° C., since such temperatures are not harmful for most freeform surfaces, in particular for articles of clothing.

In a preferred embodiment, after the application of the electronic system onto the freeform surface, the at least one contact surface is connected to conductive yarns, encapsulated conductor tracks, wires, or the like. For this purpose, the contact surfaces for the contacting should be suitably formed by solder contacts, weld contacts, press button contacts or stitch contacts. Contact surfaces are called stitch contacts here which can be pierced by a needle. In an embodiment of the contact surfaces as stitch contacts, it can be advantageous also to encapsulate the stitch contacts. The contact surfaces can, for example, have the form of press buttons so that they can be contacted with a corresponding counter-piece. A contact surface formed for contacting by stitch contacts could, for example, made perforated and/or very thin so that a piercing is possible. It is particularly simple by such simple contacting possibilities to apply a plurality of electronic systems onto a freeform surface and to connect them to one another.

For the case that a plurality of electronic components should be applied to a substrate, it is advantageous to apply them as a component cluster with a spacing from one another which is as small as possible, advantageously approximately centrally on the substrate. Electronic components are thus only arranged on a small part of a total surface of the substrate so that the flexibility and bendability of the substrate is only reduced in a small area by electronic components, while the remaining surface is available for the stretchable contact structure which fans open.

A particularly good protection against mechanical strain of the electronic system is achieved when at least the surface of the substrate having the conductor tracks of the contact structure and having the at least one electronic component is encapsulated. In this respect, the contact surfaces can be left free so that the encapsulation does not make the contacting of the electronic system more difficult.

The encapsulation and/or the substrate are preferably produced from an elastomer or a thermoplastic elastomer and particularly preferably from polyurethane, silicone, rubber, latex or the like, since these materials are particularly suitable due to their flexibility.

The modulus of elasticity of the material used is advantageously less than 0.2 GPa. A modulus of elasticity of less than 0.02 GPa is particularly advantageous. The modulus of elasticity can in particular be between 0.006 and 0.01 GPa. A particularly good flexibility and thus a particularly high wearing comfort are hereby achieved.

The most varied electronic components can be used. MEMs, chips, modularized subsystems, memory media as well as transmission and reception apparatus are only some of a number of possibilities. They can be connected to the contact structure by, for example, soldering or bonding. It is helpful for this purpose previously to apply a mask for bounding the solder or adhesive.

In a preferred embodiment, the contact structure which fans open is formed by conductor tracks which are formed in accordance with the functional principle of a spring, i.e. if the conductor track is stretched in the direction of its main direction, the total length of the conductor track only increases negligibly so that no damage to the conductor track occurs by this stretching. The conductor tracks can, for example, be curved alternately in mutually oppositely disposed directions from a main direction, as is the case, for example, with a wave-like, zigzag type or meandering shape of the conductor tracks. In this respect, the thickness of the conductor tracks can be constant, but can also change continuously or abruptly from the electronic component to the contact surface.

In particular with a curved design of the conductor tracks alternating in mutually oppositely disposed directions from a main direction, a conductor track cross-section of at least some conductor tracks can be less than 1 mm$^2$ and particularly preferably less than 0.5 mm$^2$ or 0.1 mm$^2$. Particularly preferably, structure sizes of 100 μm or contact spacings of 200 μm can even be made possible. It is possible by such small structure sizes to arrange contacting points of electronic components close to one another. The electronic components can hereby be installed together in a small partial region of the electronic system. The region of the electronic system in which the flexibility is reduced by electronic components can therefore be very small.

In a further advantageous embodiment, the conductor tracks are formed from a homogeneously conductive material, i.e. a conductivity of the conductive material is preferably not given by conductive particles which are embedded in a non-conductive matrix. The conductive tracks can particularly advantageously be formed as metallic conductor tracks. In this respect conductor tracks are understood as metallic conductor tracks which at least predominantly comprise metal and are composed as completely as possible of metal. Conductor tracks of adhesives containing metal are not considered metallic conductor tracks in the sense of the invention.

A specific resistance of the material of which the conductor tracks are composed is preferably less than 10 $\Omega$mm$^2$/m and particularly preferably less than 2 $\Omega$mm$^2$/m, 1 $\Omega$mm$^2$/m or even less than 0.1 $\Omega$mm$^2$/m or 0.02 $\Omega$mm$^2$/m. A very small voltage drop at the conductor tracks is hereby achieved.

With a formation of substrate, encapsulation and conductor tracks, as described above, for example, an electronic system can be generated which can be stretched more than 10,000 times up to at least 1%; preferably more than 20,000 times up to at least 2%, and particularly preferably more than 30,000 times or even approximately 50,000 times up to at least 2.5%, without a failure of the electronic system taking place. It is preferably even possible at least once to stretch the electronic system by up to at least 50%, preferably at least 80% or at least 300%, without a failure of the electronic system occurring.

Figure 2:
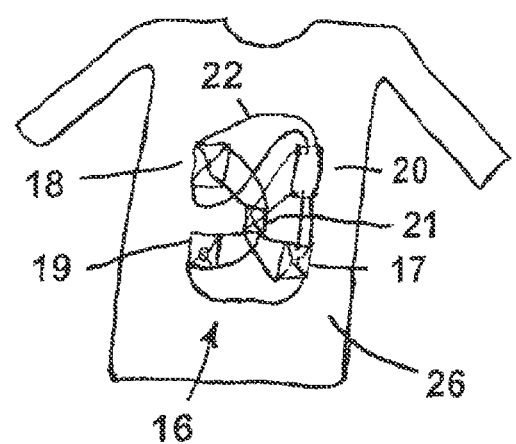
Figure 3:
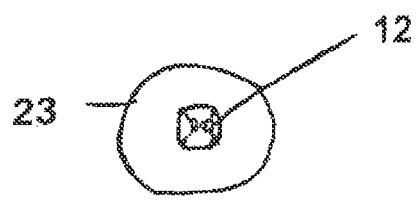
Figure 4:
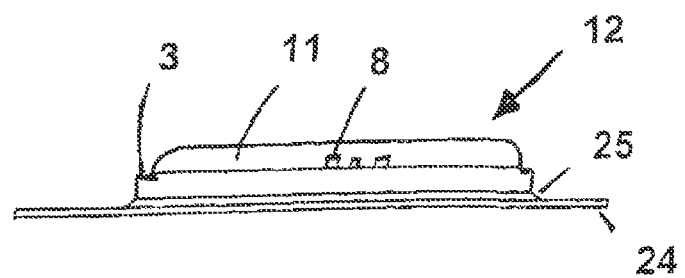
Figure 5:
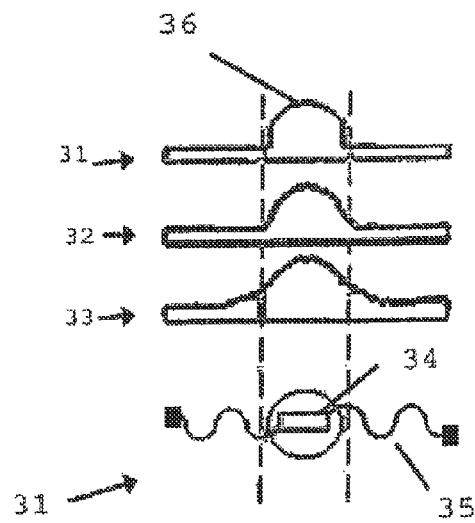
Figure 6:
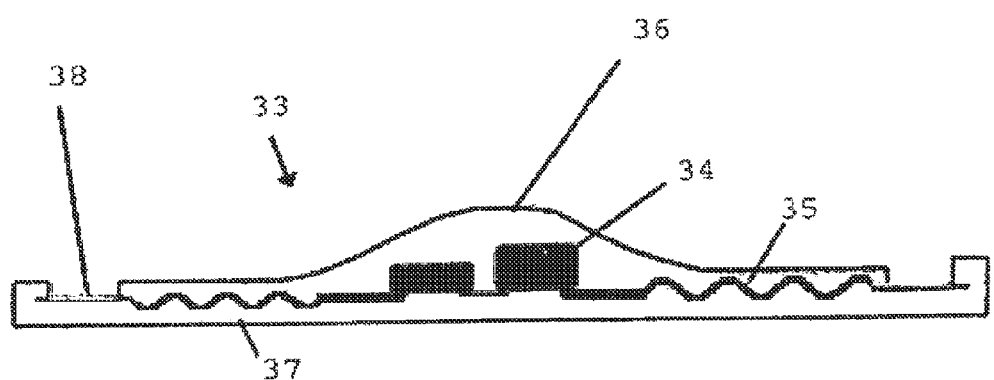

The methods in accordance with the invention as well as the electronic system in accordance with the invention and the freeform surface in accordance with the invention will be explained more precisely in the following with reference to some embodiments. There are shown FIGS. 1a to 1g a plan view and a side view of different steps of the method in accordance with the invention for generating a stretchable electronic system and a textile having such a system;

FIG. 2 a textile part having a plurality of applied electronic systems in accordance with the invention;

FIG. 3 a spherical rigid freeform surface equipped in accordance with the invention with an electronic system;

FIG. 4 a film having an electronic system in accordance with the invention;

FIG. 5 side views and a plan view of further embodiments of a system in accordance with the invention; and FIG. 6 a sectional view of a further embodiment of a system in accordance with the invention.

FIG. 1a shows an interconnect device 30 provided in the first method step. It comprises a stretchable substrate 1 which is manufactured from a thermoplastic polyurethane. A contact structure is applied to it which is composed of a plurality of conductor tracks 2 as well as contact surfaces 3 and contact points 5. The contact structure can be prepared by means of usual printed circuit board technology, preferably subtractive technology. At least one etching step can be provided in this respect. The conductor tracks 2 which are arranged between the contact points 5 and the contact surfaces 3 are formed such that, in the proximity of the contact points 5, the spacing 4a between them is much smaller than a spacing 4b in the proximity of the contact surfaces 3 which are arranged at the margin of the substrate in the embodiment and which are relatively large in relation to the contact points 5 and can therefore easily be contacted from outside. A section 6 of the interconnect device 30 is shown highly enlarged in FIG. 1b. It can be recognized here that the conductor track 2 is made in wave form and is curved alternately in mutually oppositely disposed directions from a main direction 7. It is hereby achieved that the conductor track 2 is very flexible and stretchable.

Figure 1C:
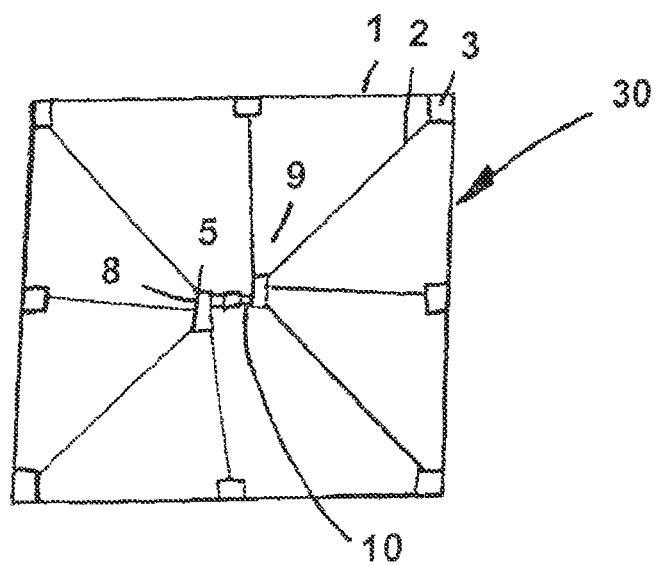

In FIG. 1c, the interconnect device 30 is shown after the second method step. In this respect, electronic components 8 have been applied in the meantime and have been electrically connected to the contact points 5, for example by soldering. Another possibility is to bond the electronic components or their contact points using a conductive adhesive such as an epoxy resin adhesive containing copper or silver. A solder resist mask, which is, however, not shown, is usually applied to the substrate before the equipping with electronic components. The equipping with the electronic components can preferably take place automatically, i.e. mechanically. The electronic components are arranged as a duster 9, i.e. the spacing 10 between the components is relatively small. It is meant by this that the spacing between two adjacent electronic components is at the same order of magnitude as the spacing between two contacts of the same component, but at least one order of magnitude smaller than the spacing of two adjacent peripheral contact surfaces 3.

Figure 1D:
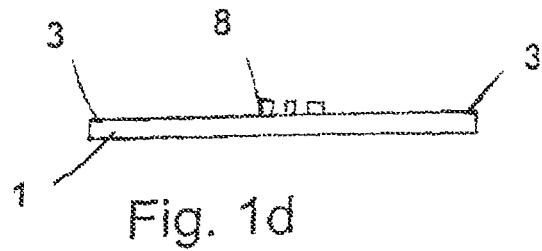

In FIG. 1d, the interconnect device 30 is shown with substrate 1, contact surfaces 3 and electronic components 8 in the side view.

Figure 1E:
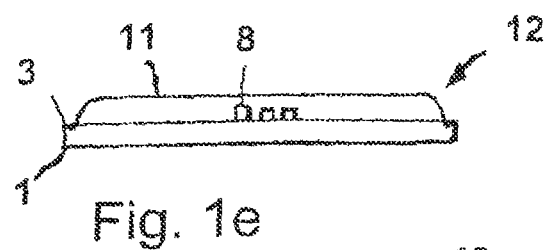

FIG. 1e shows the finished electronic system 12 in the side view. An encapsulation 11, which completely surrounds the electronic components 8 and covers the conductor tracks of the contact structure, was applied by an injection molding process. The encapsulation 11 comprises polyurethane and is therefore very stretchable. The polyurethane used for the encapsulation is not thermoplastic.

Figure 1F:
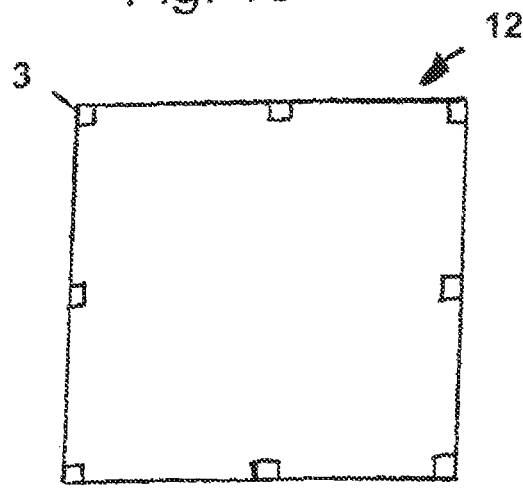

FIG. 1f likewise shows the finished electronic system, but in the plan view. Only the contact surfaces 3 are still free. Everything else is hidden beneath the encapsulation 11 and is thus no longer visible. This electronic system can be called a self-adhesive (at approx. 150° C.) fan-out package.

Figure 1G:
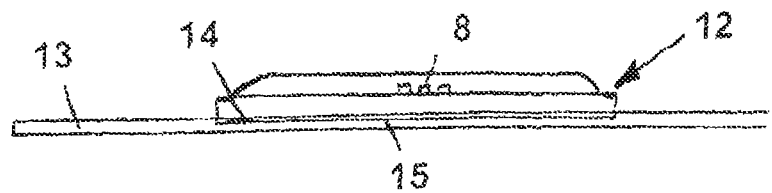

In FIG. 1g, a freeform surface 13 is shown with the electronic system 12 shown in FIG. 1e. In this embodiment, the freeform surface is made as a textile part 13. The electronic system 12 was heated in a clothing laminating press to 150° C. and pressed onto the textile part 13. The upper side 14 of the textile part was hereby pressed into the lower side 15 of the electronic system. A very stable connection hereby arises. The same happens on use of a felt-like freeform surface.

FIG. 2 shows an article of clothing 26 having an applied alarm apparatus 16. Helpless persons can, for example, be equipped herewith. A transmission and reception apparatus 17, acoustic output means 18 and optical output means 19, a storage medium 20 and stretchable electronic systems containing an energy supply 21 are stitched to the article of clothing and are modularized subsystems of the alarm apparatus. An application of the electronic systems by riveting, laminating or bonding would also be conceivable. In the embodiment, the electronic systems are connected to one another by conductive yarn 22. The transmission and reception device 17 can, for example, be configured for communication with a base station, not shown, whereby signals can be received and transmitted and, optionally, acoustic and optical emergency signals can be triggered. The article of clothing can be worn comfortably due to the use of the stretchable electronic systems 12 since it remains flexible and stretchable. The stretchability is here only slightly restricted by the electronic components. The contact structures which fan out and which adopt a much larger surface portion of the article of clothing are, however, stretchable and do not impair comfort.

FIG. 3 shows an example for a rigid freeform surface having an applied electronic system 12. The rigid freeform surface is in this respect made in the form of a sphere 23. An application onto a freeform surface formed as a sphere is only possible due to the stretchability of the electronic system 12. Flexible, but not stretchable, electronic systems 12 could only be applied to objects curved in one spatial direction such as cylindrical objects. A curvature in two spatial directions is always associated with a stretching.

In FIG. 4, an electronic system 12 applied to a film 24 is shown. The electronic system 12 is fixedly connected to the film 24 by a bonded connection 25. The film is in particular an adhesive film. Due to the application of the stretchable electronic system to an adhesive film, it can be bonded to a surface shaped as desired.

In FIG. 5, further embodiments of electronic systems 31, 32 and 33 are shown in a side view. A plan view of the electronic system 31 is shown at the bottom in FIG. 5. The electronic systems 31, 32, 33 have a continuous transition between an elevated middle region 36 in which an encapsulation material having an increased thickness is applied for covering the electronic component 34 and an outer region in which the encapsulation material covers the conductor tracks 35. Damage to the electronic system on the stretching thereof is hereby particularly reliably avoided since a stretchability is reduced due to the increased thickness of the encapsulation in the region of the electronic components, whereas the encapsulation in the outer region (i.e. over the conductor tracks of the contact structure) is preferably formed less than 200 μm thick, and particularly preferably between 50 μm and 100 μm thick, so that the electronic system is particularly easily stretchable in the outer region.

The electronic systems 31, 32, 33 each differ in a hardness of the transition between the elevated middle portion 36 and the outer portion. This transition is the hardest in the electronic system 31, i.e. with the greatest derivative of density of the thickness, while the transitions become successively softer in the electronic systems 32 and 33. On preparation of further embodiments, the transition can be freely modeled with a fixed stretchability and can be adapted, i.e. set in a controlled manner, to the demands of the respective embodiment with respect to stretchability and mechanical stability in the region of the electronic components.

The electronic system 33 is shown more exactly in the sectional view shown in FIG. 6. The lower side of the electronic system is formed by the substrate 37. Structured conductor tracks 35 are applied thereto and are shown for illustration with a wavy structure, although the waves actually do not extend, as shown in FIG. 6, in the plane of the drawing, but orthogonally thereto. The contact surfaces 38 are located outwardly, whereas electronic components 34 are arranged approximately centrally on the substrate 37. It must be mentioned that a method, i.e. the process steps for manufacturing an electronic system having a continuous transition between an elevated middle region 36 and an outer region, as is shown in FIGS. 5 and 6, or having a freeform surface having such an electronic system, can take place exactly as is explained with respect to FIGS. 1a to 1g, i.e. all features which are mentioned in connection with FIGS. 1a to 1g can also be advantageous with respect to electronic systems 33 as shown in FIG. 6.

Only the design of the encapsulation material differs from FIGS. 1e and 1g such that a transition between an elevated central region 36 and an outer region is continuous.

Contrary to FIG. 1f, in the embodiment in accordance with FIG. 6, the contact surfaces are arranged slightly spaced apart from the margin of the system 33, whereby an accidental lateral contacting is prevented. The finished electronic system is formed as shown in FIG. 6 instead of as shown in FIG. 1e. An electronic system 33 such as is shown in FIG. 6 can naturally also be applied onto a film 24, as shown in FIG. 4.

The invention claimed is:

1. A method for generating a stretchable electronic system for applying to freeform surfaces comprising:
   providing a stretchable interposer for at least one electronic component, the stretchable interposer having a stretchable substrate and a stretchable contact structure which comprises stretchable conductor tracks, fans out at an acute angle to one another at the same at least one electronic component such that the distance between the conductor tracks increases outwardly, and has contact points and peripheral contact surfaces arranged at the margin of the substrate, wherein the conductor tracks are arranged between the contact points and the contact surfaces;
   applying at least one electronic component to the interposer and connecting the at least one electronic component with the contact points; and
   encapsulating with a stretchable material.

2. The method in accordance with claim 1, further comprising;
   providing a freeform surface; and
   applying the previously encapsulated stretchable electronic system onto the freeform surface.

3. The method in accordance with claim 2, wherein a freeform surface is provided which is formed as at least one of a textile carrier or as a felt-like carrier, as a film or as a rigid freeform surface.

4. The method in accordance with claim 2, wherein the previously encapsulated interconnect device is applied to the freeform surface by at least one of bonding, laminating, riveting or stitching.

5. The method in accordance with claim 4, wherein, on the application of the stretchable electric system, the freeform surface or the stretchable electric system is heated, such that at least one of the interconnect device and the freeform surface is heated to a temperature at which at least one of a material of which the substrate is predominantly composed and the stretchable material used for the encapsulation has self-adhesive properties.

6. The method in accordance with claim 5, wherein the freeform surface or the stretchable electric system is heated to a temperature between 100° C. and 200° C.

7. The method in accordance with claim 2, wherein, after the application of the electronic system to the freeform surface, the contact surfaces are connected contacts respectively comprising at least one of conductive yarns, encapsulated conductor tracks or wires.

8. The method in accordance with claim 1, wherein a subsystem, chip, or microelectromechanical system (MEMS) is used as the at least one electronic component.

9. The method in accordance with claim 1, wherein at least one contact surface is made as a press button contact or as a stitch contact.

10. The method in accordance with claim 1, wherein the contact structure which fans out is manufactured from conductor tracks curved alternately in mutually oppositely disposed directions from a main direction, so as to extend in zigzag form, wave-like or meandering.

11. The method in accordance with claim 1, wherein at least the surface of the substrate is encapsulated with the conductor tracks of the contact structure and the at least one electronic component, with the contact surfaces left exposed.

12. The method in accordance with claim 1, wherein a material having a modulus of elasticity of less than 0.2 GPa is used as the stretchable material used for at least one of the encapsulation and the material of the substrate.

13. The method in accordance with claim 1, wherein a thermoplastic material and/or an elastomer such as polyurethane, silicone, rubber or latex is used as the stretchable material for the encapsulation or at least partly for the substrate.

14. A stretchable electronic system for applying to a freeform carrier, wherein the stretchable electronic system includes a stretchable interposer comprising a stretchable substrate and a contact structure with contact points, peripheral contact surfaces arranged at a margin of the substrate and stretchable conductor tracks arranged between the peripheral contact surfaces and the contact point, a stretchable encapsulation, and at least one electronic component, wherein the contact structure is a stretchable contact structure which fans out at an acute angle to one another at the same at least one electronic component such that the distance between the conductor tracks increases outwardly, and the conductor tracks end in said peripheral contact surfaces.

15. The stretchable electronic system in accordance with claim 14, wherein the at least one electronic component includes a subsystem, chip, or MEMS.

16. The stretchable electronic system in accordance with claim 14, wherein at least one contact surface is a press button contact or stitch contact.

17. The stretchable electronic system in accordance with claim 14, wherein the conductor tracks are curved alternately in mutually disposed directions from a main direction, extending in a zigzag form, wave-like or meandering.

18. The stretchable electronic system in accordance with claim 14, wherein at least the surface of the substrate is encapsulated with the conductor tracks of the contact structure and the at least one electronic component, with the contact surfaces being left exposed.

19. The stretchable electronic system in accordance with claim 14, wherein the stretchable material used for the encapsulation and/or the material of the substrate has a modulus of elasticity less than 0.02 GPa.

20. The stretchable electronic system in accordance with claim 14, wherein a stretchable material forming the encapsulation or a material forming a large part of the substrate includes a thermoplastic material.

21. The stretchable electronic system in accordance with claim 20, wherein the thermoplastic material has self-adhesive properties at a temperature between 100° C. and 200° C.

22. A freeform surface having at least one stretchable electronic system, wherein the electronic system is fixedly applied to the freeform surface, and wherein the stretchable electronic system includes a stretchable interposer with a stretchable substrate, a stretchable encapsulation, at least one electronic component and a contact structure comprising contact points, peripheral contact surfaces arranged at a margin of the substrate and stretchable conductor tracks arranged between the peripheral contact surfaces and the contact points, wherein the contact structure is a stretchable contact structure which fans out at an acute angle to one another at the same at least one electronic component such that the distance between the conductor tracks increases outwardly, and the conductor tracks end in said peripheral contact surfaces.

23. The freeform surface having at least one stretchable electronic system in accordance with claim 22, wherein the freeform surface includes at least one of a textile carrier, a felt-like carrier, a film or a rigid freeform surface.

24. The freeform surface having at least one stretchable electronic system in accordance with claim 22, wherein the stretchable electronic system is attached to the freeform surface by at least one of riveting, an adhesive bond, a lamination or stitch connection.

25. The freeform surface having at least one stretchable electronic system in accordance with claim 22, wherein the contact surfaces are connected to contacts respectively comprising at least one of conductive yarns, encapsulated conductor tracks or wires.

* * * * *